United States Patent [19]

Patrick et al.

[11] Patent Number: 5,394,086
[45] Date of Patent: Feb. 28, 1995

[54] FEED CABLE SYSTEM FOR COILS IN HIGH MAGNETIC FIELDS

[75] Inventors: John L. Patrick, Chagrin Falls; Paul T. Orlando, Mentor; Nicholas J. Mastandrea, Bedford Heights, all of Ohio

[73] Assignee: Picker International, Inc., Highland Hts., Ohio

[21] Appl. No.: 104,362

[22] Filed: Aug. 9, 1993

[51] Int. Cl.$^6$ ............................................. G01V 3/00
[52] U.S. Cl. .................................... 324/318; 324/322
[58] Field of Search ............... 324/300, 307, 309, 311, 324/312, 313, 314, 318, 322; 128/653.5

[56] References Cited

U.S. PATENT DOCUMENTS

| | | | |
|---|---|---|---|
| 4,587,493 | 5/1986 | Sepponen | 324/318 |
| 5,036,282 | 7/1991 | Morich et al. | 324/318 |
| 5,185,576 | 2/1993 | Vavrek et al. | 324/318 |
| 5,235,279 | 8/1993 | Kaufman et al. | 324/318 |
| 5,311,134 | 5/1994 | Yamagata et al. | 324/322 |

OTHER PUBLICATIONS

"Highly Linear Asymmetric Transverse Gradient Coil Design for Head Imaging", Myers, et al. SMRM Abstracts Aug. 1991, p. 711.

*Primary Examiner*—Louis Arana
*Attorney, Agent, or Firm*—Fay, Sharpe, Beall, Fagan, Minnich & McKee

[57] ABSTRACT

A toroidal vacuum dewer (22) holds a superconducting magnet assembly (10) which generates a substantially temporally constant magnetic field through a central bore (12). A whole body gradient coil (30) and a whole body RF coil assembly (32) are mounted to a cylindrical member (24) of the dewar. An insertable gradient coil assembly (40) is selectively insertable into and removable from the bore. The insertable gradient coil assembly includes gradient coils for selectively generating magnetic field gradients along three mutually orthogonal axes, e.g. x, y, and z-axes. A flexible cable (42) connects the insertable gradient coil with a series of current amplifiers (44). The current amplifiers selectively generate current pulses which are fed along feed conductors (84) of the coil assembly and which return along return conductors (86) of the cable. The feed and return conductors are configured such that the net feed and the net return current traverse the same effective path in opposite directions. Stated more mathematically, $$\mathrm{E}\bar{R}_i \times (\bar{I}_i \times \bar{B}_{ext}) = 0$$

where $\bar{R}_i$ is the distance of the i-th conductor from the common path, $\bar{I}_i$ is the current carried by the i-th conductor, and $\bar{B}_{ext}$ is the temporally constant magnetic field generated by the main magnetic field assembly. Because the net feed and return current pulses follow the same path, i.e. are coaxial, the net torque and the net force from the interaction between the current pulses and the temporally constant magnetic field are zero.

13 Claims, 3 Drawing Sheets

FEED CABLE SYSTEM FOR COILS IN HIGH MAGNETIC FIELDS

BACKGROUND OF THE INVENTION

The present invention relates to conveying electrical currents through high magnetic fields. It finds particular application in conjunction with magnetic resonance imaging and will be described with particular reference thereto. The present invention will also find application in other fields in which high magnetic fields are present, particularly strong, pulsed magnetic fields.

Commonly, magnetic resonance imaging devices have a built-in gradient coil surrounding the patient receiving bore. For imaging smaller areas of the patient and conducting specialized studies, insertable gradient coils are sometimes inserted into the bore. These insertable coils include surface coils, head coils, biplanar gradient coils, and other gradient coils which can be received in the main field bore.

The insertable gradient coils are powered by current pulses to generate magnetic field gradients along selectable x, y, and z-axes. Flexible electrical conductors which extend through the bore from an external current source to the inserted coil carry these electrical pulses.

The cables which carry the current pulses to the insertable gradient coils for MRI imaging must conduct large currents. The cables must also be able to retract, i.e. coil and flex, within the bore to allow the insertable coil to be moved into and out of the magnet. When a current passes through a conducting cable in the presence of a strong external magnetic field, as is present in an MRI magnet bore, an orthogonal Lorenz force is generated. The Lorenz force, i.e. the force caused by the interaction of orthogonal components of current and magnetic fields, causes mechanical displacement of the cable. The forces can manifest themselves in the mechanical displacements of the cable or may give rise to torques which cause cable rotation.

Mechanical movement of the cable is disruptive and potentially dangerous to the patient. Further, the movements cause offensive acoustic noise which can be unnerving to the patient. Moreover, the movement and torques cause fatigue of the cable, particularly at the interconnection between the cable and the insertable gradient coil.

In the past, others have used paired, parallel conductors for insertable gradient coils. Such parallel or biaxial coils are particularly susceptible to mechanical movement. The two currents flow along displaced axes and through the same magnetic field. This causes opposite forces orthogonal to each of the displaced cable conductors causing torques and mechanical movement of the cable.

Others have suggested using twisted wire pairs. The twisted pairs of leads were twisted in a helix around the central axis and were mechanically constrained into the helical configuration. With the two wires of the twisted pair mechanically fixed together, the opposing forces balance and cancel, i.e. the net mechanical force is zero. However, the torque is not zero. Due to the non-zero torque, each current pulse to the gradient coils causes the cable pairs to twist, leading to vibration, mechanical noise, and potential connection and component fatigue.

Coaxial cable is used in many applications, primarily for high frequency, high voltage, low current transmission where characteristic impedance is important. The feed cables to insertable gradient coils must carry higher currents than normally carried by coaxial cables, but at lower voltages with less impedance characteristic criticality.

The present invention contemplates a new and improved cable lead assembly for insertable gradient coils which overcomes the above-referenced problems and others.

SUMMARY OF THE INVENTION

In accordance with the present invention, a magnetic resonance imaging apparatus is provided in combination with the insertable gradient coil having a lead wire thereto. The lead wire has one or more feed leads and one or more return leads. The one or more feed and return leads are configured such that the vector sum of the feed and return currents lie along a common path, but in opposite directions.

In accordance with another aspect of the present invention, the cabling for an insertable gradient coil for a magnetic resonance imaging apparatus is configured such that the current pulses flowing therethrough produce no net torque on the cable when the current pulses interact with a magnetic field.

In accordance with a more limited aspect of the present invention, the insertable gradient coil cable is coaxial.

In accordance with another more limited aspect of the present invention, a multiple lead cable is defined in which:

$$\Sigma \bar{R}_i \times (\bar{I}_i \times \bar{B}_{ext}) = 0$$

is satisfied, where $\bar{B}_{ext}$ is an external magnetic field vector whose orientation is arbitrary relative to the direction of current $\bar{I}_i$ in each conductor and $\bar{R}_i$ is a vector from the geometric center of the cable bundle to a center of each individual conductor i.

One advantage of the present invention is that it uses flexible, retractable cables for feeding an insertable gradient coil in the presence of an external magnetic field.

Another advantage of the present invention is that it does not require mechanical constraints to confine mechanical motion and vibration.

Another advantage of the present invention resides in extended life of coupling connections.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
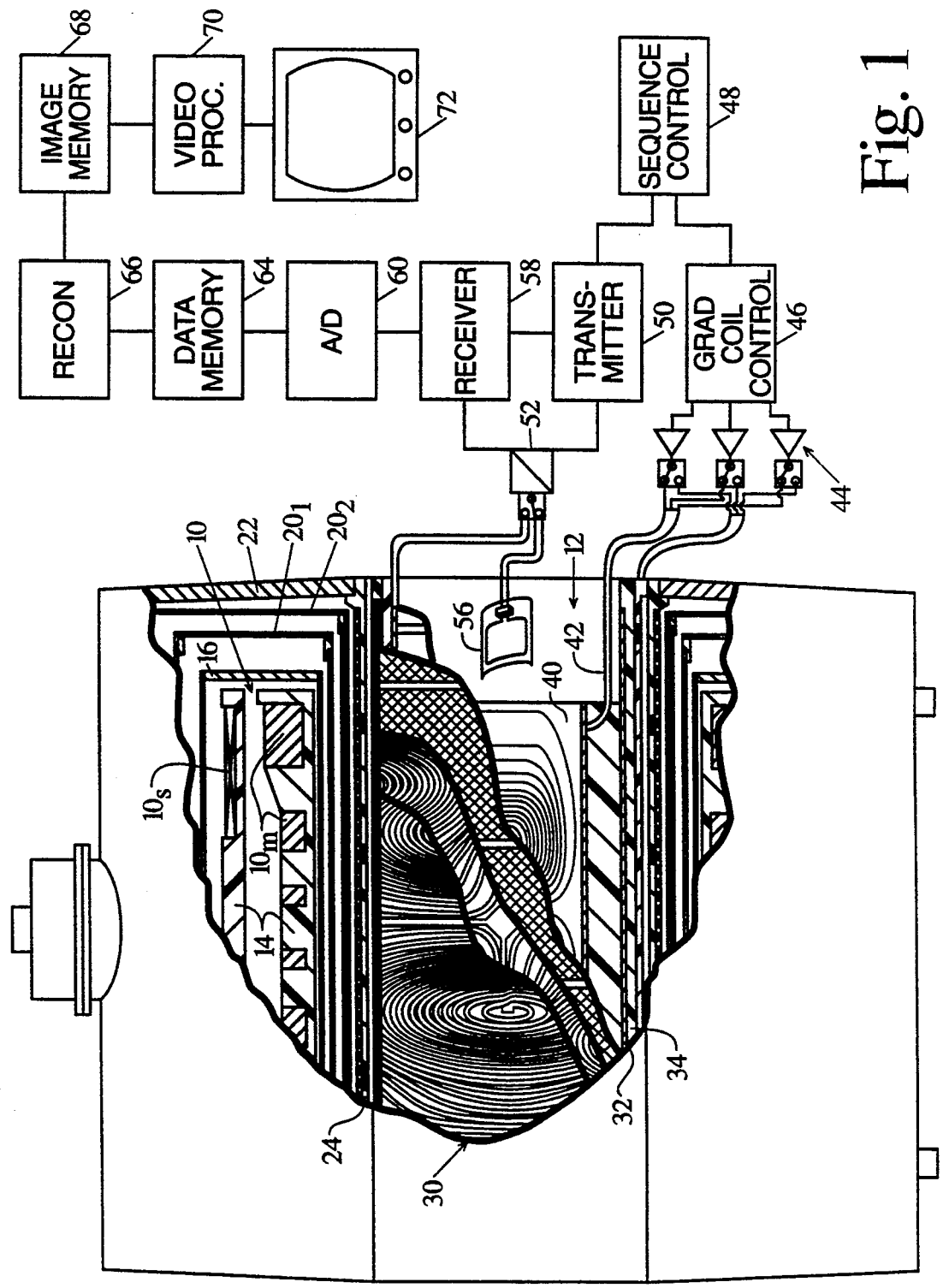
FIG. 1 is a diagrammatic illustration of a magnetic resonance imaging device in accordance with the present invention.

With reference to FIG. 1, a self-shielded superconducting magnetic field coil assembly 10 generates a temporally constant magnetic field along a longitudinal or z-axis of a central bore 12. Windings of a main coil $10_m$ and a shield coil $10_s$ are mounted on a dielectric formers 14 which are received in a toroidal helium vessel or can 16. The helium vessel is filled with liquid helium to maintain the coils at a sufficiently low temperature that the coils remain superconducting in the presence of the imposed magnetic fields.

The toroidal helium vessel 16 is surrounded by a series of cold shields $20_1, 20_2, \ldots, 20_n$. The cold shields are maintained at progressively colder temperatures toward the helium reservoir. In the preferred embodiment, two cold shields at about 20° K. and 60° K., respectively, are provided. A toroidal, outer vacuum vessel 22 encases the cold shields to define a toroidal vacuum reservoir therearound. Layers of thin mylar insulation are preferably arranged between the vacuum vessel 24 and the cold shields. The vacuum vessel 22 includes a cylindrical member 24 through which the temporally constant magnetic field is generated.

A circularly cylindrical, whole body gradient coil assembly 30 is mounted to the cylindrical member 24 of the vacuum vessel. Preferably, the gradient coil assembly is a self-shielded whole body gradient coil assembly. A circularly cylindrical whole body RF coil assembly 32 is also supported by the cylindrical member 24 of the vacuum reservoir. Preferably, an RF shield is disposed between the whole body RF coil and the whole body gradient coil assembly. A circularly cylindrical dielectric cosmetic sleeve 34 protects the whole body RF coil and the whole body gradient coil assembly from damage and provides support therefor.

An insertable gradient coil assembly 40 is selectively inserted into and removable from the bore for creating gradient magnetic fields in limited regions and for procedures for which the whole body gradient coil assembly is not appropriate. In the illustrated embodiment, the insertable gradient coil assembly 40 is a biplanar gradient coil of the construction illustrated in U.S. Pat. No. 5,036,282. Other insertable gradient coils, including those designed for specific regions of the body, e.g. the head, are also contemplated. A flexible cable assembly 42 connects the insertable gradient coil assembly with a series of gradient amplifiers 44. The gradient amplifiers are controlled by a gradient control means 46 to produce high current gradient pulses in accordance with a magnetic resonance imaging sequence provided by a sequence control means 48. The cable assembly includes a plurality of cables preferably including a cable for each of x, y, and z-coils of the insertable gradient coil assembly. A second set of gradient amplifiers are connected between the gradient control means 46 and the whole body gradient coil assembly 30.

The sequence control 48 further controls a radio frequency transmitter 50, preferably a digital transmitter. The digital transmitter generates radio frequency signals which are conveyed to the whole body RF coils 32. The RF transmitters 50 are selectively connectable by a quadrature combiner/divider circuit 52 and a cable 54 with an insertable RF coil 56, a surface coil in the illustrated embodiment. The insertable and whole body RF coils are connected by way of the quadrature combiner/divider circuit 52 with a digital receiver means 58. The receiver means demodulates received magnetic resonance signals. Analog-to-digital converters 60 and other interface circuitry convert the magnetic resonance signals to digital signals which are stored in a data memory 64. A reconstruction means 66 reconstructs the magnetic resonance signals into a digital image representation which is stored in a digital image memory 68. A video processor means 70 converts the digital image representations into the appropriate format for display on a video monitor 72.

Figure 2:
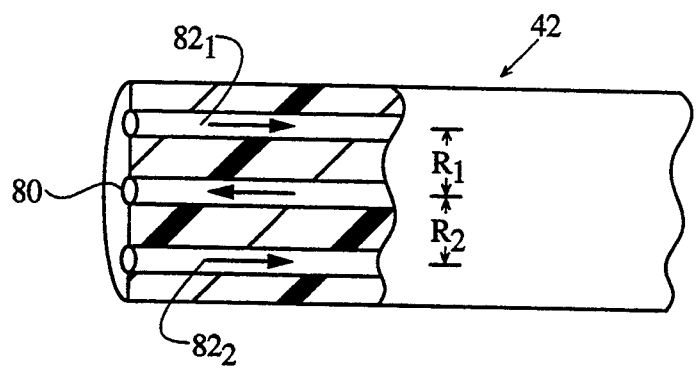
FIG. 2 illustrates a preferred three-conductor cable assembly for feeding the insertable gradient coil.

With reference to FIG. 2, each insertable gradient coil cable 42 includes a central conductor 80 and a pair of coplanar side conductors $82_1$ and $82_2$. The two side conductors $82_1$ and $82_2$ are disposed parallel to and equidistant from the central conductor 80. In this manner, when the side conductors each carry one half of the feed or return current, the effective return and feed current paths are coaxial. When one of the side conductors carries 1/m-th of the current and the second carries (m−1)/m-th of the current, the second side conductors is (m−1) times as far from the central conductor as the first.

Figure 3:
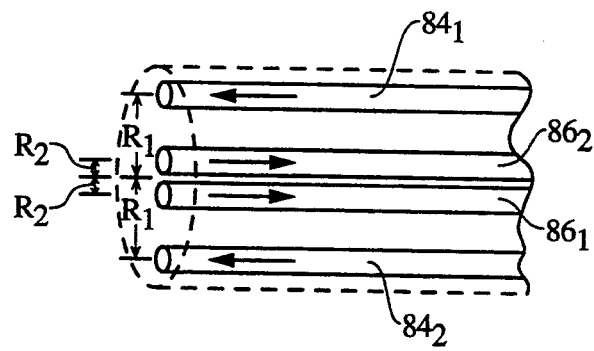
FIG. 3 illustrates a planar four-conductor cable arrangement for feeding the insertable gradient coil.

Various other configurations are contemplated in which the effective feed and return paths are coaxial. For example, as illustrated in FIG. 3, there are a pair of feed conductors $84_1$ and $84_2$ which are displaced a distance $R_1$ from a geometric center. A pair of return conductors $86_1$ and $86_2$ are displaced from the effective center by a distances $R_2$. When these conductors each carry the same current, the effective current paths for the feed and return current are coaxial.

Figure 4:
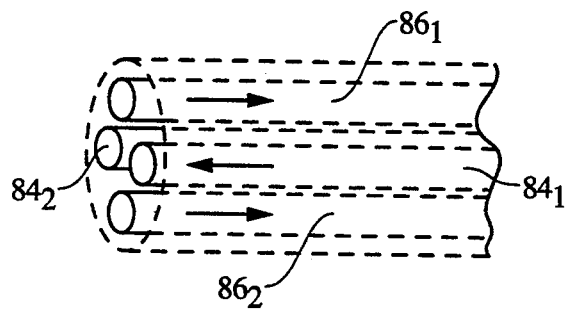
FIG. 4 illustrates another four-conductor embodiment of the cable for the insertable gradient coil.
Figure 5:
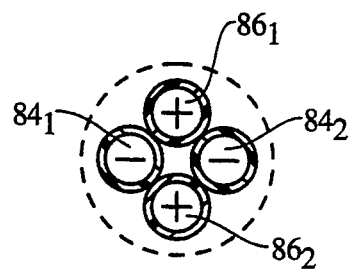
FIG. 5 is an end view of the cable of FIG. 4.

Other wire configurations which meet the requirement are:

$$\Sigma \bar{R}_i \times (\bar{I}_i \times \bar{B}_{ext}) = 0 \tag{1},$$

where $\bar{R}_i$ is the distance between the effective axis of current flow and a center of the i-th individual conductor, $\bar{I}_i$ is the current flow through the i-th conductor, and $\bar{B}_{ext}$ is an arbitrary external magnetic field from the magnetic field coil assembly 10. FIG. 4 and 5 illustrate another four conductor embodiment which is symmetric in two dimensions relative to a geometric center.

Figure 6:
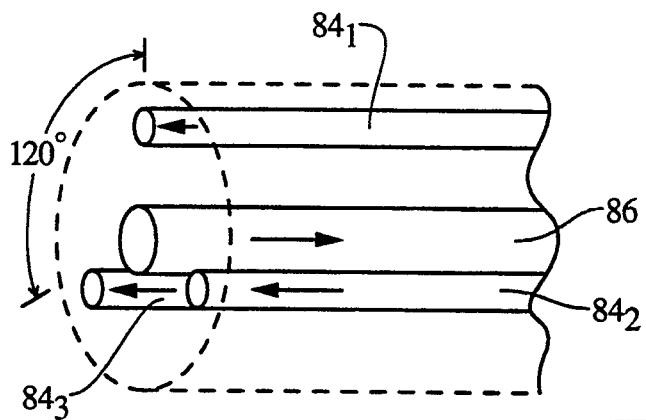
FIG. 6 illustrates another four-conductor embodiment of the cable for feeding the insertable gradient coil.

With reference to FIG. 6, the feed current is divided into three conductors $84_1, 84_2, 84_3$ which are spaced equidistant from the central axis of a central return conductor 86 and symmetrically thereabout, i.e. at 120° intervals. The three feed conductors each carry one third of the current of each current pulse.

Figure 7:
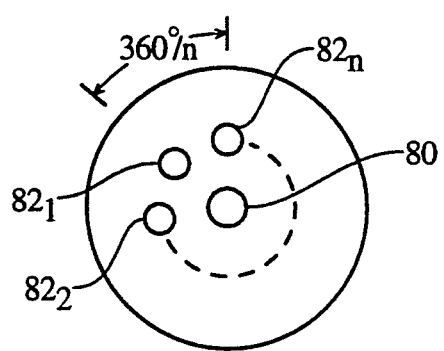
FIG. 7 illustrates an n+1 conductor cable for feeding the insertable gradient coil assembly; and, FIG. 8 illustrates a limit as n approaches infinity in which the cable for feeding the insertable gradient coil is a coaxial two-conductor cable.

With reference to FIG. 7, this relationship can be extended to n+1 conductors. That is, one of the feed and return currents are conveyed along a central conductor 80 and the other is conveyed along n equidistant surrounding conductors $82_1, 82_2, \ldots, 82_n$ at 360°/n intervals, with each carrying 1/n-th of the current.

Figure 8:
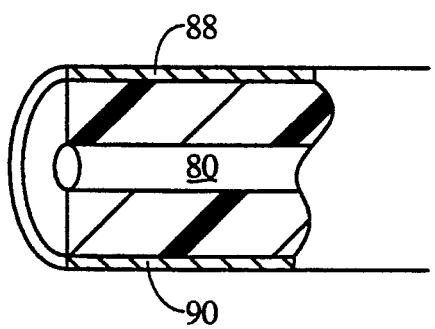

With reference to FIG. 8, as n approaches infinity, the surrounding conductors 82 merge into a single cylindrical conductor 88 of a coaxial conductor. Electrical insulation 90 is provided between the feed and return conductors. For simplicity of manufacture, the aboveembodiments have one or both of the current flows divided in equal parts and have the relative current flows a common distance or distances from the common axis. It is to be appreciated that there are two additional degrees of freedom from meeting Equation (1) by varying the relative percentage of the current flow through each conductor and the radii or distance of each conductor from the common axis.

With reference again to FIGS. 4 and 5, the conditions of Equation (1) can be satisfied with no conductor at the geometric center. In this embodiment, the four conductors carry the same level of current along paths equidistant from the geometric center, i.e. on corners of a rectangle. This provides an easily manufactured cable feed that is immune to inductively induced torques.

Similar multi-conductor cables are provided for supplying current to and returning current from each of three orthogonally-oriented gradient coil sets. In this manner, the summation of torques generated by each conductor is zero.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging apparatus in which an insertable gradient coil is inserted in a central bore through which a temporally constant magnetic field is generated, the insertable gradient coil being connected by a flexible cable with a source of current pulses for providing current pulses to the insertable gradient coil for generating magnetic field gradients, THE IMPROVEMENT COMPRISING:

the cable including a plurality of conductors for conducting feed and return current pulses, the number and placement of the conductors being described by:

$$E\bar{R}_i \times (\bar{I}_i \times \bar{B}_{ext}) = 0$$

where $\bar{B}_{ext}$ is the temporally constant magnetic field, $\bar{I}_i$ is a current carried by the i-th conductor and $\bar{R}_i$ is a vector from a common axis of the conductors to the i-th conductor, whereby a summation of torques generated by the feed and return current pulses through the plurality of feed and return conductors is zero.

2. In the magnetic resonance imaging system as set forth in claim 1, THE IMPROVEMENT FURTHER COMPRISING:

the cable being a coaxial cable including a central conductor surrounded by insulation and a circumferentially surrounding sheet conductor, one of the central and sheet surrounding conductors carrying the feed current pulses and the other of the central and surrounding conductors carrying the return current pulses.

3. In the magnetic resonance imaging system as set forth in claim 1, THE IMPROVEMENT FURTHER COMPRISING:

the cable having a central conductor and a pair of equispaced conductors, the central and equispaced conductors being coplanar, the central conductor carrying one of the feed and return current pulses and the equispaced conductors each carrying half of the other of the feed and return current pulses.

4. In the magnetic resonance imaging system as set forth in claim 1, THE IMPROVEMENT FURTHER COMPRISING:

a central conductor and n circumferential conductors equispaced from the central conductor, the n circumferential conductors being displaced at 360°/n angular increments and each carrying 1/n-th of one of the return and feed current pulses and the central conductor carrying the other of the feed and return current pulses.

5. A magnetic resonance imaging system comprising:

a main magnetic field coil assembly which generates a substantially temporally constant magnetic field through a central bore thereof;

an insertable gradient coil assembly removably inserted in the bore;

a gradient coil current pulse supply means including a plurality of insertable gradient coil amplifiers mounted exterior to the bore which are controlled by a gradient amplitude control means;

a plurality of insertable gradient cables, each insertable gradient cable including at least one feed conductor for feeding feed current pulses from the insertable gradient coil amplifiers to the insertable gradient coil assembly and at least one return conductor for conveying return current pulses from the insertable gradient coil assembly to the gradient current pulse supply means, the at least one feed conductor and the at least one return conductor being configured such that effective feed and return current paths are coaxial along a common axis.

6. The magnetic resonance imaging system as set forth in claim 5 further including:

an insertable radio frequency coil disposed within the insertable gradient coil for receiving magnetic resonance signals emanating from the subject;

a radio frequency receiver connected with the radio frequency receiving coil;

a reconstruction means for reconstructing magnetic resonance signals from the radio frequency receiver into image representations.

7. The magnetic resonance imaging system as set forth in claim 6 further including a radio frequency transmitter, the radio frequency transmitter being connected with one of the insertable radio frequency coil and a whole body radio frequency coil mounted to the bore.

8. The magnetic resonance imaging system as set forth in claim 7 further including a whole body gradient coil permanently mounted to the bore.

9. The magnetic resonance imaging system as set forth in claim 5 wherein each of the plurality of insertable gradient coil cables includes a plurality of conductors for conducting feed and return current pulses, the number and placement of the conductors being described by:

$$E\bar{R}_i \times (\bar{I}_i \times \bar{B}_{ext}) = 0$$

where $\bar{B}_{ext}$ is the temporally constant magnetic field from the main magnetic field coil assembly, $\bar{I}_i$ is a current pulse carried by the i-th conductor and $\bar{R}_i$ is a vector from the common axis to the i-th conductor, whereby a summation of torques generated by the feed and return current pulses through the plurality of feed and return conductors is zero.

10. The magnetic resonance imaging system as set forth in claim 9 wherein each cable is a coaxial cable including a central conductor surrounded by insulation and a circumferentially surrounding conductor, one of the central and surrounding conductors carrying the feed current pulses and the other of the central and surrounding conductors carrying the return current pulses.

11. The magnetic resonance imaging system as set forth in claim 9 wherein each cable has a central conductor and a pair of equispaced conductors, the central and equispaced conductors being coplanar, the central conductor carrying one of the feed and return current pulses and the equispaced conductors each carrying half of the other of the feed and return current pulses.

12. The magnetic resonance imaging system as set forth in claim 9 wherein a central conductor and n peripheral conductors are spaced equidistant from the central conductor, the n peripheral conductors being displaced at 360°/n angular increments and each carrying 1/n-th of one of the return and feed current pulses and the central conductor carrying the other of the feed and return current pulses.

13. The magnetic resonance imaging system as set forth in claim 9 wherein two pairs of parallel conductors carry current in opposite directions, the conductors are disposed at corners of a rectangle with diagonally opposite conductors carrying current in the same direction.

* * * * *